United States Patent
Ma et al.

(10) Patent No.: US 10,620,541 B2
(45) Date of Patent: Apr. 14, 2020

(54) MASK PLATE, EXPOSURE SYSTEM AND EXPOSURE METHOD

(71) Applicants: BOE TECHNOLOGY GROUP CO., LTD., Beijing (CN); BEIJING BOE DISPLAY TECHNOLOGY CO., LTD., Beijing (CN)

(72) Inventors: Guojing Ma, Beijing (CN); Changjian Xu, Beijing (CN); Dan Wang, Beijing (CN); Jinyu Ren, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 2 days.

(21) Appl. No.: 15/503,926

(22) PCT Filed: Aug. 2, 2016

(86) PCT No.: PCT/CN2016/092850
§ 371 (c)(1),
(2) Date: Feb. 14, 2017

(87) PCT Pub. No.: WO2017/071354
PCT Pub. Date: May 4, 2017

(65) Prior Publication Data
US 2017/0285480 A1 Oct. 5, 2017

(30) Foreign Application Priority Data
Oct. 26, 2015 (CN) .......................... 2015 1 0703580

(51) Int. Cl.
*G03F 7/20* (2006.01)
*G02F 1/1334* (2006.01)
*G02F 1/133* (2006.01)

(52) U.S. Cl.
CPC .......... *G03F 7/2057* (2013.01); *G02F 1/1334* (2013.01); *G02F 1/13306* (2013.01)

(58) Field of Classification Search
CPC ....... G03F 7/2057; G09G 3/18; G09G 3/3674
See application file for complete search history.

(56) References Cited

U.S. PATENT DOCUMENTS 6,464,692 B1 * 10/2002 Ruiz ....................... A61F 9/007
349/86
7,403,216 B2 * 7/2008 Kong ..................... G03B 27/04
347/239

(Continued)

FOREIGN PATENT DOCUMENTS

CN 101963762 A 2/2011
CN 201867584 U 6/2011

(Continued)

OTHER PUBLICATIONS

International Search Report and Written Opinion dated Oct. 26, 2016; PCT/CN2016/092850.

(Continued)

*Primary Examiner* — Michelle M Iacoletti
(74) *Attorney, Agent, or Firm* — Ladas & Parry LLP

(57) ABSTRACT

A mask plate, an exposure system and an exposure method are disclosed. The mask plate includes a control unit (10) and a liquid crystal cell (20), wherein the control unit (10) is electrically connected to the liquid crystal cell (20) and configured to control the liquid crystal cell (20) to render a mask pattern. The mask plate can fulfill the requirements for various mask patterns, which not only save the manufacturing cost, but also simplifies the process operation.

16 Claims, 4 Drawing Sheets

(56) References Cited

U.S. PATENT DOCUMENTS

| | | | | |
|---|---|---|---|---|
| 2002/0015305 | A1* | 2/2002 | Bornhorst | F21S 10/007 |
| | | | | 362/293 |
| 2004/0229080 | A1* | 11/2004 | Ikeda | H01L 51/001 |
| | | | | 428/690 |
| 2005/0083498 | A1* | 4/2005 | Jeng | G03F 7/0035 |
| | | | | 355/53 |
| 2009/0200555 | A1* | 8/2009 | Ishihama | G02F 1/136259 |
| | | | | 257/59 |

FOREIGN PATENT DOCUMENTS

| | | |
|---|---|---|
| CN | 202421717 U | 9/2012 |
| CN | 202453606 U | 9/2012 |
| CN | 202548530 U | 11/2012 |
| CN | 105182628 A | 12/2015 |
| CN | 20512119 U | 3/2016 |

OTHER PUBLICATIONS

The First Chinese Office Action dated Nov. 27, 2017; Appln. No. 201510703580.5.

* cited by examiner

US 10,620,541 B2

MASK PLATE, EXPOSURE SYSTEM AND EXPOSURE METHOD

FIELD OF THE ART

Embodiments of the disclosure relate to the field of display technologies, more particularly, to a mask plate, an exposure system and an exposure method.

BACKGROUND

A mask plate is used as a tool for transferring fine patterns in mass replication and production of mask fabrication processes, which plays an important role in the fabrication of substrates. Especially during the curing of sealant, it is achieved under the protection of the mask plate, otherwise faulty display will be generated. During a fabrication process of substrates, different products have different patterns, which means mask plates with different patterns have to be used. In real production, different mask plates also have to be changed frequently to manufacture different products.

Mask plates are normally of a high price. Meanwhile, any fault caused during the design, manufacture, transmission, storage or replacement and mounting processes will make a mask plate unusable, which causes the designers, producers and users of the mask plates much trouble and economic losses.

SUMMARY

In first aspect of the disclosure, it is provided a mask plate, which comprises a control unit and a liquid crystal cell, wherein the control unit is electrically connected to the liquid crystal cell and configured to control the liquid crystal cell to render a mask pattern.

In second aspect of the disclosure, it is provided an exposure system, which comprises the above-mentioned mask plate.

In third aspect of the disclosure, it is provided an exposure method performed by using the above-mentioned mask plate, the method comprises: determining a control signal according to a mask pattern; inputting the control signal to the control unit such that the control unit controls the liquid crystal cell to render the mask pattern; and exposing a substrate to be exposed by using the mask plate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 3b schematically illustrates a pattern of a mask plate according to the pattern of the seal agent of FIG. 3a;

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Embodiment 1

Figure 1:
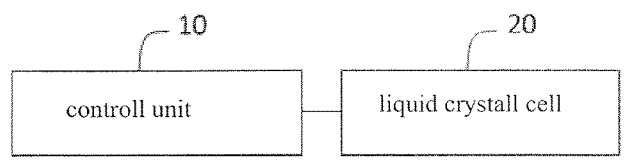
FIG. 1 schematically illustrates a diagram of a mask plate in accordance with an embodiment of the disclosure.

FIG. 1 schematically illustrates a diagram of a mask plate in accordance with an embodiment of the disclosure. As illustrated in FIG. 1, the mask plate comprise a control unit 10 and a liquid crystal cell 20, wherein the control unit 10 is electrically connected to the liquid crystal cell 20 and configured to control the liquid crystal cell 20 to render a predetermined mask pattern.

The above mask plate renders various mask patterns as needed. In this sense, the embodiment makes it possible for one mask plate to correspond to products needing various mask patterns, which not only avoids designing of various mask plates, but also saves mask cost as multiple mask plates are no longer needed. As UV irradiation is performed without changing the mask plate during the production, the mask plate does not need to be dismounted during its life span, which is of a simple process and saves energy consumption.

Embodiment 2

Figure 2A:
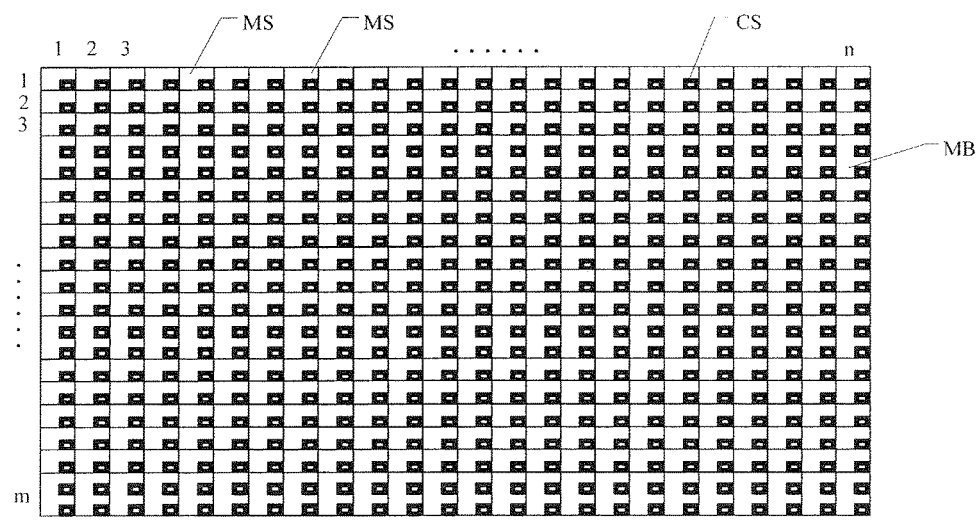
FIG. 2a schematically illustrates a diagram of a mask plate in accordance with another embodiment of the disclosure.
Figure 2B:
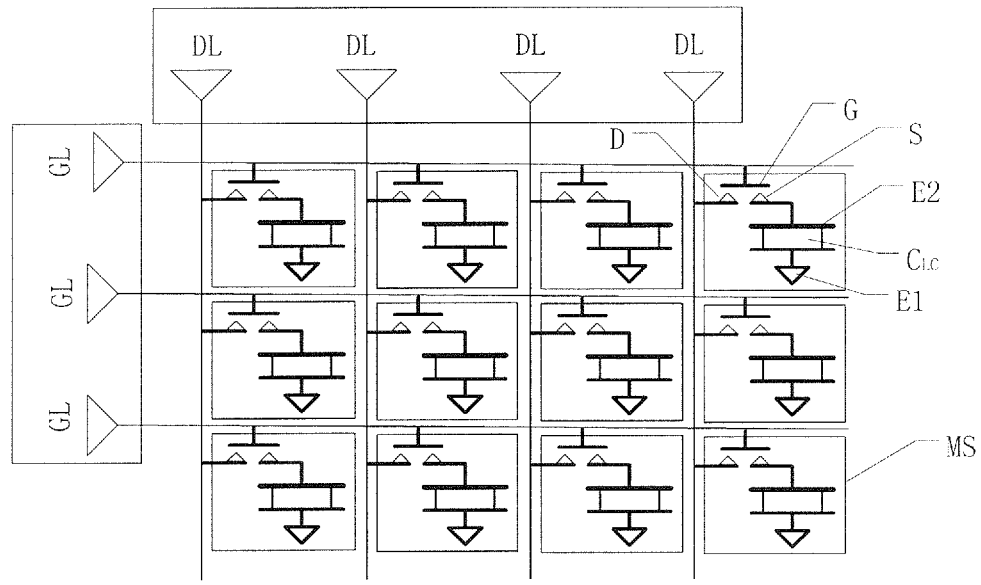
FIG. 2b schematically illustrates a partial diagram of a mask plate in accordance with an embodiment of the disclosure.

The embodiment provides a mask plate comprising a control unit and a liquid crystal cell. As illustrated in FIGS. 2a and 2b, the mask plate further comprises a plurality of gate lines GL and a plurality of data lines DL, the plurality of gate lines GL and the plurality of data lines DL intersect each other to partition the liquid crystal cell into a plurality of mask sub-regions MS arranged as an array. The control unit comprises a plurality of control switches CS, each mask sub-region MS has a control switch CS disposed therein, and the control switch CS is configured to control light-transmitting state of the mask sub-region MS. The light-transmitting states comprise light-fully-transmitted state, light-tight state and grayscale-transmitted (i.e., light-partially-transmitted) state. In the disclosure, a region consisting of at least two mask sub-regions MS is referred to as a mask block MB.

As an example, the liquid crystal cell 20 comprises a plurality of mask sub-regions MS arranged as an array (m rows and n columns), each mask sub-region MS has a corresponding control switch CS, such as a Thin Film Transistor (TFT) disposed therein. The control unit 10 realizes the control of the individual regions of the liquid crystal cell 20 by controlling each TFT.

A predetermined mask pattern typically comprises a fully-exposed region, a non-exposed region and a partially-exposed region. Liquid crystals in the mask sub-regions corresponding to the fully-exposed regions are in the light-fully-transmitting state. Liquid crystals in the mask sub-regions corresponding to the non-exposed regions are in the light-tight state. Liquid crystals in the mask sub-regions corresponding to the partially-exposed regions are in the light-partially-transmitted state.

It is seen from the above that it is possible that control signals are determined according to the exposure pattern (i.e., the predetermined mask pattern), then the control unit 10 controls the control switches CS corresponding to respective mask sub-regions according to the control signals, such that the respective control switches CS control the light-transmitting states of liquid crystals in the corresponding mask sub-regions and allow the mask plate to eventually render the predetermined mask pattern.

Figure 2C:
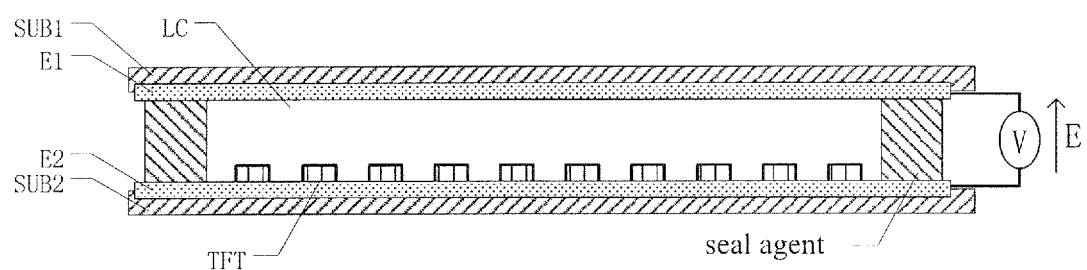
FIG. 2c schematically illustrates a cross section view of a liquid crystal cell in accordance with an embodiment of the disclosure.

FIG. 2c schematically illustrates a cross section view of a liquid crystal cell comprising a plurality of mask sub-regions. As an example, each mask sub-region MS comprises a first substrate SUB1 and a second substrate SUB2 disposed as opposed to each other; liquid crystals LC disposed between the first substrate SUB1 and the second substrate SUB2; a first electrode E1 disposed between the first substrate SUB1 and the liquid crystals LC; and a second electrode E2 disposed between the second substrate SUB2 and the liquid crystals LC. The first electrode E1 is for example a common electrode, and the second electrode E2 is for example a pixel electrode. As an example, the first substrate SUB1 and the second substrate SUB2 are made of transparent substrates, such as glass; the two electrodes are made of transparent electrically-conductive material such as ITO and the like. The plurality of mask sub-regions are connected to each other and at least one of the first electrode and the second electrode may be integral.

Still referring to FIG. 2b, the control switch is for example a TFT, and the TFT is configured to control the light-transmitting states of the corresponding mask sub-region, such as light-fully-transmitted state, light-tight state and light-partially-transmitted state. The TFT comprises a source electrode S, a drain electrode D and a gate electrode G, one of the source electrode S and the drain electrode D is connected to the data line DL, the other is connected to the second electrode E2, and the gate electrode G is connected to the gate line GL. By controlling the light-transmitting states of the liquid crystals in the corresponding mask sub-regions through the TFT disposed therein, the liquid crystal cell 20 renders the predetermined mask pattern.

In at least some of the embodiments, the liquid crystals in the mask sub-regions are Polymer Dispersed Liquid Crystals (PDLCs). When no external voltage is applied, the PDLCs do not form a regular electric field, optical axes of the liquid crystal particles are randomly oriented and render a disorder state. Incident light is strongly scattered, and a non-transparent state is rendered. When an external voltage is applied, for example an electric field E is applied between the first electrode E1 and the second electrode E2 in FIG. 2c, the optical axes of the liquid crystal particles are aligned in a direction perpendicular to the film surface, which is in the same direction as the electric field, a transparent state is rendered.

When the liquid crystals in the mask sub-regions are PDLCs, the light-transmitting state of the liquid crystals in the mask sub-regions is light-fully-transmitted or light-tight. Accordingly, the control switches, i.e., the TFTs, control the light-transmitting states of the PDLCs in the corresponding mask sub-regions according to the control signals, thereby allowing the liquid crystal cell to render the predetermined mask pattern.

In at least some of the embodiments, the control unit 10 is configured to periodically scan or drive the TFT, such that the TFT controls the light-transmitting states of the liquid crystals in the corresponding mask sub-regions to remain the same during a predetermined time period. As a result, the liquid crystal cell 20 renders the mask pattern during the predetermined time period. A length of the predetermined time period may be adjusted as needed, such as from 5 minutes to 15 minutes.

It is seen from the above description that the on-off states of the TFTs in the corresponding mask sub-regions are controlled by the control signals, thereby controlling the light-transmitting states of the liquid crystals. For example, when the mask plate is used to cure seal agent, the light-transmitting states of the respective mask sub-regions are controlled according to requirements of the pattern of the seal agent. As an example illustrated in FIG. 3a, which is a pattern of seal agent, where the white region is to be exposed, while the black regions need no exposure.

Figure 3A:
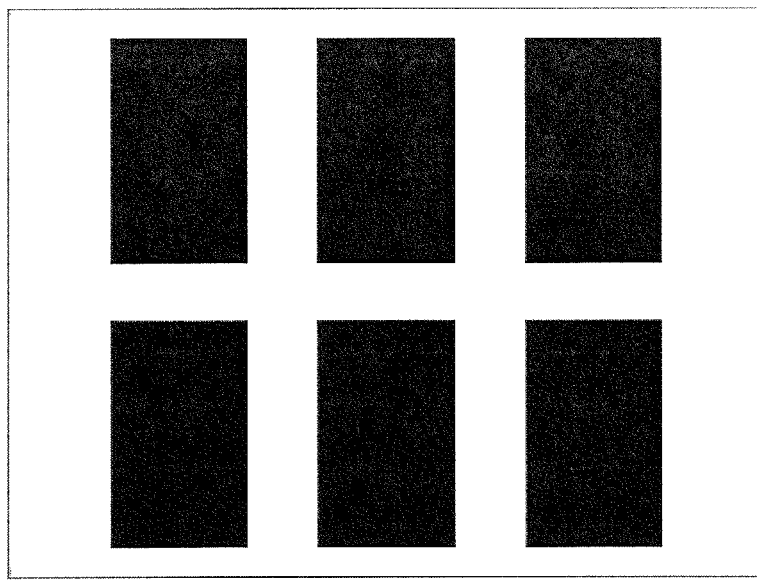
FIG. 3a schematically illustrates a pattern of a seal agent.

If the above mask plate is to be used to cure the pattern of seal agent on the substrate, then control signals have to be designed first according to the pattern of seal agent as illustrated in FIG. 3a, and then the control signals are input to the control unit, such that the control unit turns on/off the TFTs according to the control signals, which further controls the light-transmitting states of liquid crystals of the plurality of mask sub-regions.

Figure 3B:
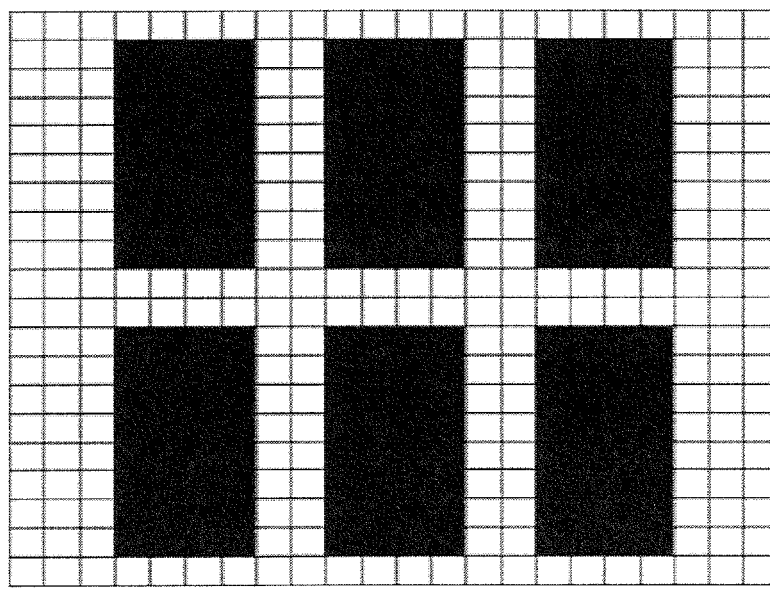
Figure 4:
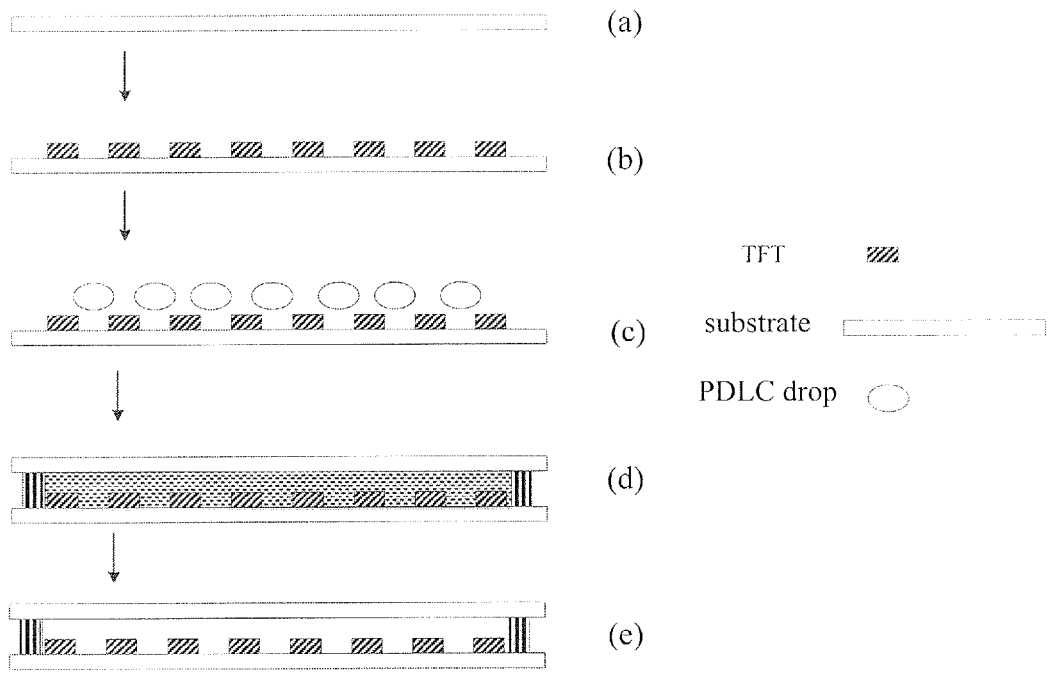
FIG. 4 schematically illustrates a diagram of a fabrication process of a liquid crystal cell.

With reference to FIG. 3b, which is the mask pattern rendered by the mask plate under the control of the control signals. With reference to FIGS. 3a and 3b, the light-transmitting state of the liquid crystals of the plurality of mask sub-regions corresponding to the exposed region of the seal agent pattern is light-fully-transmitted, and the light-transmitting state of the liquid crystals of the mask sub-regions corresponding to the non-exposed region of the seal agent pattern is light-tight.

The mask pattern rendered by the above mask plate is relatively simple, as the embodiment is only for illustrative purpose. It can be contemplated that the mask plate may realize various simple or complicated mask patterns. This is because the mask plate described in the embodiment comprises a plurality of mask sub-region, and the light-transmitting states of the liquid crystals within the mask sub-regions are controlled by the corresponding control switches. Therefore, the light-transmitting states of the liquid crystals within the mask sub-regions can be changed by changing the control signals, which in turn allows the mask plate to render the needed mask pattern.

With reference to FIGS. 4a to 4e, which schematically illustrates a diagram of a fabrication process of a liquid crystal cell of the above mask plate, an example of the liquid crystals LCs being PDLCs is described. For the convenience of description, steps of forming electrodes or dielectric layers in the liquid crystal cell are omitted. However, a person skilled in the art will understand that such formation steps may be performed as necessary.

First, TFTs are fabricated on a substrate, and then PDLCs are dripped on the TFTs. After the dripping step, another substrate is cell-assembled therewith and packed. Finally, polymerization is performed by heating the cell, a PDLC film is formed on the TFT. By this means, it can control the light-transmitting states of the PDLCs by controlling power on-off state of the TFTs. When the TFTs are powered off, the TFTs control the PDLCs in the corresponding regions to be in a light-tight state. When the TFTs are powered on, the TFTs control the PDLCs in the corresponding regions to be in a light-fully-transmitted state.

In the embodiment, the control unit is configured to control the on-off states of the TFTs in the corresponding mask sub-regions according to the control signals, thereby controlling the light-transmitting states of the liquid crystals, allowing the mask plate to render a predetermined mask pattern. As the light-transmitting states of the liquid crystals in the respective mask sub-regions may be adjusted by changing the control signals, the embodiment makes it possible for one mask plate to correspond to various mask patterns. In this way, it is no longer necessary to design multiple mask plates for various mask patterns, which saves the trouble of designing various mask plates. In the meantime, as multiple mask plates are no longer needed, the cost of mask plates is also reduced. When various mask patterns are needed, UV irradiation may be performed without changing the mask plate. As a result, the mask plate does not need to be dismounted during its life span, which is of a simple process and saves energy consumption.

Embodiment 3

The embodiment of the disclosure provides an exposure system, comprising the mask plate as described in any of the above embodiments. As an example, the mask pattern is a seal agent pattern.

In at least some of the embodiments, the liquid crystal cell is partitioned into a plurality of mask sub-regions arranged into an array, at least two mask sub-region forms a mask block; the control unit is configured to control light-transmitting states of the mask blocks such that the mask plate renders the seal agent pattern.

In at least some of the embodiments, the exposure system further comprises a light source device. The light source device is for example a UV light source device.

In case that the exposure system of the embodiment is used to cure seal agent, because the seal agent pattern is relatively simple, the mask plate can render the seal agent pattern by being controlled through the mask blocks of the mask plate, instead of being controlled through respective mask sub-regions of the mask plate one by one, herein, each of mask blocks includes at least two mask sub-regions. Such an operation simplifies the control method. Accordingly, the control unit controls the mask blocks according to the control signals such that the mask plate renders the seal agent pattern. The control signals are generated according to the predetermined seal agent pattern.

In actual applications, the mask plate is placed on a substrate to be patterned (or exposed), and then the control signals are determined according to the exposed pattern, next, the control signals are input to the control unit, such that the control unit controls the liquid crystal cell to render the predetermined exposed pattern according to the control signals. Finally, UV light emitted by the UV light source device is used to irradiate the mask plate rendering the exposed pattern, thereby finishing the patterning process of the substrate.

In the exposure system of the embodiment, since the mask plate of the above embodiments is used, the mask plate can be controlled as needed to render various mask patterns. As a result, a single exposure system can correspond to products needing various mask patterns. When various mask patterns are needed, patterning processes thereof can be accomplished without changing the mask plate. As a result, the mask plate does not need to be dismounted during its life span, which is of a simple process and saves energy consumption. In the meantime, considering that mask plates are of relatively high cost, not requiring unmounting from time to time can also help to reduce wearing to the mask plates caused during the unmounting process, which makes the life span of the mask plates longer and cost lower. At the same time, as one mask plate can be used to render various mask patterns, it is no longer necessary to design multiple mask plates having different patterns, which also reduces the design and fabrication cost of the mask plates.

Embodiment 4

Figure 5:
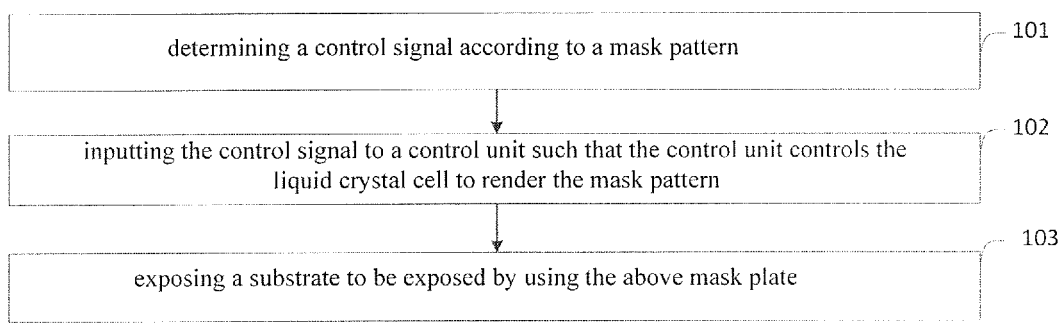
FIG. 5 schematically illustrates a flow chart of an exposure method in accordance with an embodiment of the disclosure.

The embodiment provides an exposing method (also referred as "patterning process") performed by using the mask plate described in any of the embodiments. With reference to FIG. 5, the method comprises the following steps:

Step 101: determining a control signal according to a mask pattern.

In the step, the mask pattern is for example a seal agent pattern. The control signal comprises information such as regions in the seal agent pattern which need to be fully-exposed, not exposed or partially-exposed.

Step 102: inputting the control signal to a control unit such that the control unit controls the liquid crystal cell to render the mask pattern.

In the step, the mask plate comprises for example a plurality of mask sub-regions arranged along directions of rows and columns, each mask sub-region has a corresponding control switch disposed therein. The control switch is configured to control light-transmitting states of the liquid crystals of the corresponding mask sub-region according to the control signals determined in step 101, such that the liquid crystal cell renders the predetermined mask pattern.

The control switch is for example a TFT. The light-transmitting state of liquid crystals of the corresponding mask sub-region controlled by the TFT according to the control signal may be light-fully-transmitted, light-tight and light-partially-transmitted.

The control unit, according to the control signal, controls the light-transmitting state of the liquid crystals of the mask sub-regions corresponding to the fully-exposed region to be light-fully-transmitted, controls the light-transmitting state of the liquid crystals of the mask sub-regions corresponding to the non-exposed region to be light-tight, and controls the light-transmitting state of the liquid crystals of the mask sub-regions corresponding to the partially-exposed region to be light-partially-transmitted.

Step 103: exposing a substrate to be exposed by using the above mask plate.

As the mask plate has already rendered the predetermined mask pattern in step 102, in this step it only needs to use the mask plate to expose the substrate, thereby finishing the patterning process.

As an example, when the above mask plate is used to cure the seal agent pattern, the substrate is a substrate on which the seal agent is to be cured, the predetermined exposed pattern is the seal agent pattern. After allowing the mask plate to form the predetermined seal agent pattern according to the operations of steps 101 to 102, the mask plate is used for expose the substrate, thereby finishing curing of the seal agent.

Furthermore, when the mask plate of the above embodiments is used to cure seal agent, because the seal agent pattern is relatively simple, the mask plate can render the seal agent pattern by being controlled through the mask blocks of the mask plate, instead of being controlled through respective mask sub-regions of the mask plate one by one, herein, each of mask blocks includes at least two mask sub-regions. Such an operation simplifies the control method.

As an example, the control signals are determined according to the seal agent pattern and then input to the control unit, such that the control unit controls the multiple mask blocks to render the predetermined exposing pattern according to the control signals, allowing the mask plate to render the seal agent pattern. Here the seal agent pattern comprises a fully-exposed region, a non-exposed region and a partially-exposed region.

The control unit controls the light-transmitting state of the liquid crystals of the mask sub-regions corresponding to the fully-exposed region to be light-fully-transmitted, controls the light-transmitting state of the liquid crystals of the mask sub-regions corresponding to the non-exposed region to be light-tight, and controls the light-transmitting state of the liquid crystals of the mask sub-regions corresponding to the partially-exposed region to be light-partially-transmitted. Finally, the mask plate is used for expose the substrate on which the seal agent is to be cured, thereby finishing curing of the seal agent.

In the exposure method provided by the embodiment, since the mask plate of the above embodiments is used, the mask plate can be controlled as needed to render various mask patterns. As a result, a single mask plate can correspond to products needing various mask patterns. When various mask patterns are needed, patterning processes thereof may be accomplished without changing the mask plate. As a result, the mask plate does not need to be dismounted during its life span, which is of a simple process and saves energy consumption. In the meantime, considering that mask plates are of relatively high cost, not requiring unmounting from time to time can also help to reduce wearing to the mask plates caused during the unmounting process, which makes the life span of the mask plates longer and cost lower. At the same time, as one mask plate can be used to render various mask patterns, it is no longer necessary to design multiple mask plates having different patterns, which also reduces the design and fabrication cost of the mask plates.

What is described above is related to the illustrative embodiments of the disclosure only and not limitative to the scope of the disclosure; the scopes of the disclosure are defined by the accompanying claims.

The present application claims priority from Chinese Application No. 201510703580.5, filed on Oct. 26, 2015, the disclosure of which is incorporated herein by reference in its entirety

What is claimed is:

1. A mask plate, comprising:
 a liquid crystal cell, partitioned into a plurality of mask sub-regions arranged as an array, at least two mask sub-regions form a mask block;
 a control unit, electrically connected to the liquid crystal cell and configured to control the mask block to render a mask pattern, the control unit comprising a plurality of control switches;
 a plurality of gate lines and a plurality of data lines, the plurality of gate lines and the plurality of data lines intersecting each other to partition the liquid crystal cell into the plurality of mask sub-regions arranged as the array,
 wherein each mask block is provided with one of the control switches, and each control switch comprises a thin film transistor, the thin film transistor is configured to control a light-transmitting state of an entirety of the mask block by controlling a light-transmitting state of each mask sub-region in the mask block.

2. The mask plate of claim 1, wherein the light-transmitting state comprises light-fully-transmitted state, light-tight state or light-partially-transmitted state.

3. The mask plate of claim 1, wherein each mask sub-region comprises:
 a first substrate and a second substrate disposed as opposed to each other;
 liquid crystals disposed between the first substrate and the second substrate;
 a first electrode disposed between the first substrate and the liquid crystals; and
 a second electrode disposed between the second substrate and the liquid crystals.

4. The mask plate of claim 3, wherein the thin film transistor comprises a source electrode, a drain electrode and a gate electrode, one of the source electrode and the drain electrode is connected to the data line, the other is connected to the second electrode, and the gate electrode is connected to the gate line.

5. The mask plate of claim 1, wherein the liquid crystals are polymer dispersed liquid crystals.

6. The mask plate of claim 1, wherein the control unit periodically scans the thin film transistor such that the thin film transistor controls the light-transmitting states of the liquid crystals in the corresponding mask sub-region to remain the same during a predetermined time period.

7. The mask plate of claim 6, wherein the predetermined time period ranges from 5 minutes to 15 minutes.

8. An exposure system comprising the mask plate of claim 1.

9. The exposure system of claim 8, wherein the mask pattern is a pattern of seal agent.

10. The exposure system of claim 9, wherein the control unit is configured to control light-transmitting states of the mask blocks such that the mask plate renders the pattern of seal agent.

11. The exposure system of claim 8, further comprising a light source device.

12. An exposure method performed by using the mask plate of claim 1, comprising:
 determining a control signal according to a mask pattern;
 inputting the control signal to the control unit such that the control unit controls the liquid crystal cell to render the mask pattern; and
 exposing a substrate to be exposed by using the mask plate.

13. The exposure method of claim 12, wherein the substrate is a substrate on which seal agent is to be cured, the mask pattern is a pattern of the seal agent.

14. The exposure method of claim 13, wherein the pattern of the seal agent comprises a fully-exposed region, a non-exposed region and a partially-exposed region.

15. The exposure method of claim 14, wherein the control unit controls light-transmitting state of the liquid crystals in a mask block corresponding to the fully-exposed region to be light-fully-transmitted, controls light-transmitting state of the liquid crystals in a mask block corresponding to the non-exposed region to be light-tight, and controls light-transmitting state of the liquid crystals in a mask block corresponding to the partially-exposed region to be light-partially-transmitted.

16. A mask plate, comprising:
a liquid crystal cell, comprising a plurality of first mask sub-regions and a plurality of mask blocks; and
a control unit, electrically connected to the liquid crystal cell and comprising:
a first control switch, disposed in each first mask sub-region; and
a second control switch, disposed in each mask block, wherein the control unit is configured to control a light-transmitting state of each first mask sub-region through the first control switch and is further configured to control a light-transmitting state of each mask block through the second control switch to make the mask plate present a mask pattern;
wherein each mask block comprises at least two second mask sub-regions, the second control switch is configured to control the light-transmitting state of each mask block by controlling a light-transmitting state of each second mask sub-regions in the mask block.

* * * * *